(12) United States Patent
Pendharkar et al.

(10) Patent No.: US 11,482,613 B2
(45) Date of Patent: *Oct. 25, 2022

(54) HYBRID ACTIVE-FIELD GAP EXTENDED DRAIN MOS TRANSISTOR

(71) Applicant: TEXAS INSTRUMENTS INCORPORATED, Dallas, TX (US)

(72) Inventors: Sameer P. Pendharkar, Allen, TX (US); John Lin, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/272,025

(22) Filed: Feb. 11, 2019

(65) Prior Publication Data

US 2019/0172930 A1 Jun. 6, 2019

Related U.S. Application Data

(60) Continuation of application No. 15/226,036, filed on Aug. 2, 2016, now Pat. No. 10,205,001, which is a
(Continued)

(51) Int. Cl.
| | |
|---|---|
| *H01L 29/66* | (2006.01) |
| *H01L 29/06* | (2006.01) |
| *H01L 29/40* | (2006.01) |
| *H01L 29/417* | (2006.01) |
| *H01L 29/423* | (2006.01) |

(Continued)

(52) U.S. Cl.
CPC .... *H01L 29/66681* (2013.01); *H01L 29/0653* (2013.01); *H01L 29/0696* (2013.01); *H01L 29/0882* (2013.01); *H01L 29/402* (2013.01); *H01L 29/41758* (2013.01); *H01L 29/4238* (2013.01); *H01L 29/7816* (2013.01)

(58) Field of Classification Search
CPC ............. H01L 27/088; H01L 21/336; H01L 29/402; H01L 29/66681; H01L 29/4238; H01L 29/7816; H01L 29/0882; H01L 29/0696; H01L 29/41758
See application file for complete search history.

(56) References Cited

U.S. PATENT DOCUMENTS

| | | |
|---|---|---|
| 5,304,827 A | 4/1994 | Malhi et al. |
| 5,777,366 A | 7/1998 | Contiero et al. |

(Continued)

FOREIGN PATENT DOCUMENTS

WO    WO2010046794 A1    4/2010

*Primary Examiner* — Matthew C Landau
*Assistant Examiner* — Dmitriy Yemelyanov
(74) *Attorney, Agent, or Firm* — Andrew R. Ralston; Charles A. Brill; Frank D. Cimino

(57) ABSTRACT

An integrated circuit includes an extended drain MOS transistor with parallel alternating active gap drift regions and field gap drift regions. The extended drain MOS transistor includes a gate having field plates over the field gap drift regions. The extended drain MOS transistor may be formed in a symmetric nested configuration. A process for forming an integrated circuit containing an extended drain MOS transistor provides parallel alternating active gap drift regions and field gap drift regions with a gate having field plates over the field gap drift regions.

28 Claims, 6 Drawing Sheets

Related U.S. Application Data continuation of application No. 14/284,696, filed on May 22, 2014, now Pat. No. 9,608,088, which is a division of application No. 13/281,260, filed on Oct. 25, 2011, now Pat. No. 8,754,469.

(60) Provisional application No. 61/406,640, filed on Oct. 26, 2010.

(51) Int. Cl.
 *H01L 29/78* (2006.01)
 *H01L 29/08* (2006.01)

(56) References Cited

U.S. PATENT DOCUMENTS

| | | | |
|---|---|---|---|
| 6,160,290 A | 12/2000 | Pendharkar | |
| 6,211,552 B1* | 4/2001 | Efland | H01L 29/7835 |
| | | | 257/343 |
| 6,878,603 B2 | 4/2005 | Bromberger et al. | |
| 6,900,101 B2 | 5/2005 | Lin | |
| 7,851,317 B2 | 12/2010 | Kim | |
| 2009/0096022 A1 | 4/2009 | Chang et al. | |
| 2009/0140335 A1* | 6/2009 | Schneider | H01L 29/0847 |
| | | | 257/344 |
| 2009/0256199 A1* | 10/2009 | Denison | H01L 29/66681 |
| | | | 257/343 |
| 2009/0256212 A1* | 10/2009 | Denison | H01L 29/0653 |
| | | | 257/408 |
| 2010/0032754 A1 | 2/2010 | Kawaguchi | |
| 2011/0147844 A1* | 6/2011 | Smith | H01L 29/66575 |
| | | | 257/368 |

\* cited by examiner

HYBRID ACTIVE-FIELD GAP EXTENDED DRAIN MOS TRANSISTOR

CROSS REFERENCE TO RELATED APPLICATIONS

Under 35 U.S.C. §§ 119(e), 120, 121, this continuation application claims priority to and benefits of U.S. patent application Ser. No. 15/226,036 (TI-67357.1A), filed on Aug. 2, 2016, which is a continuation of U.S. patent application Ser. No. 14/284,696 (TI-67357.1), filed on May 22, 2014, which is a divisional application of U.S. patent application Ser. No. 13/281,260, filed on Oct. 25, 2011, which claims priority to and benefit of U.S. Provisional Appl. No. 61/406,640, filed on Oct. 26, 2010. The entireties of the above referenced applications are hereby incorporated herein by reference.

FIELD

This disclosure relates to the field of integrated circuits. More particularly, this disclosure relates to extended drain MOS transistors in integrated circuits.

BACKGROUND

An integrated circuit may contain an extended drain metal oxide semiconductor (MOS) transistor with a drift region in the drain region adjacent to the channel region, such as a laterally diffused metal oxide semiconductor (LDMOS) transistor, a double-diffused metal oxide semiconductor (DMOS) transistor or a drain extended metal oxide semiconductor (DEMOS) transistor. Generally, an average doping in the drift region is less than half an average doping density in the source region of the MOS transistor. An extended drain MOS transistor with the drift region covered by a gate extension field plate, sometimes referred to as a field gap MOS transistor, may exhibit a breakdown voltage above 10 volts, but may have an undesirably large resistance in the drain due to a field oxide element in the drain to terminate the field plate. An extended drain MOS transistor with no field plate over the drift region, sometimes referred to as an active gap MOS transistor, may undesirably exhibit a breakdown voltage below 10 volts and degraded reliability due to hot carrier generation at an edge of the gate.

SUMMARY

The following presents a simplified summary in order to provide a basic understanding of one or more aspects of the disclosure. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

An integrated circuit may include an extended drain MOS transistor with parallel alternating active gap drift regions and field gap drift regions. The extended drain MOS transistor includes a gate having field plates over the field gap drift regions. A symmetric nested configuration of the extended drain MOS transistor may be formed. A process of forming the integrated circuit is disclosed.

DETAILED DESCRIPTION

Figure 1A:
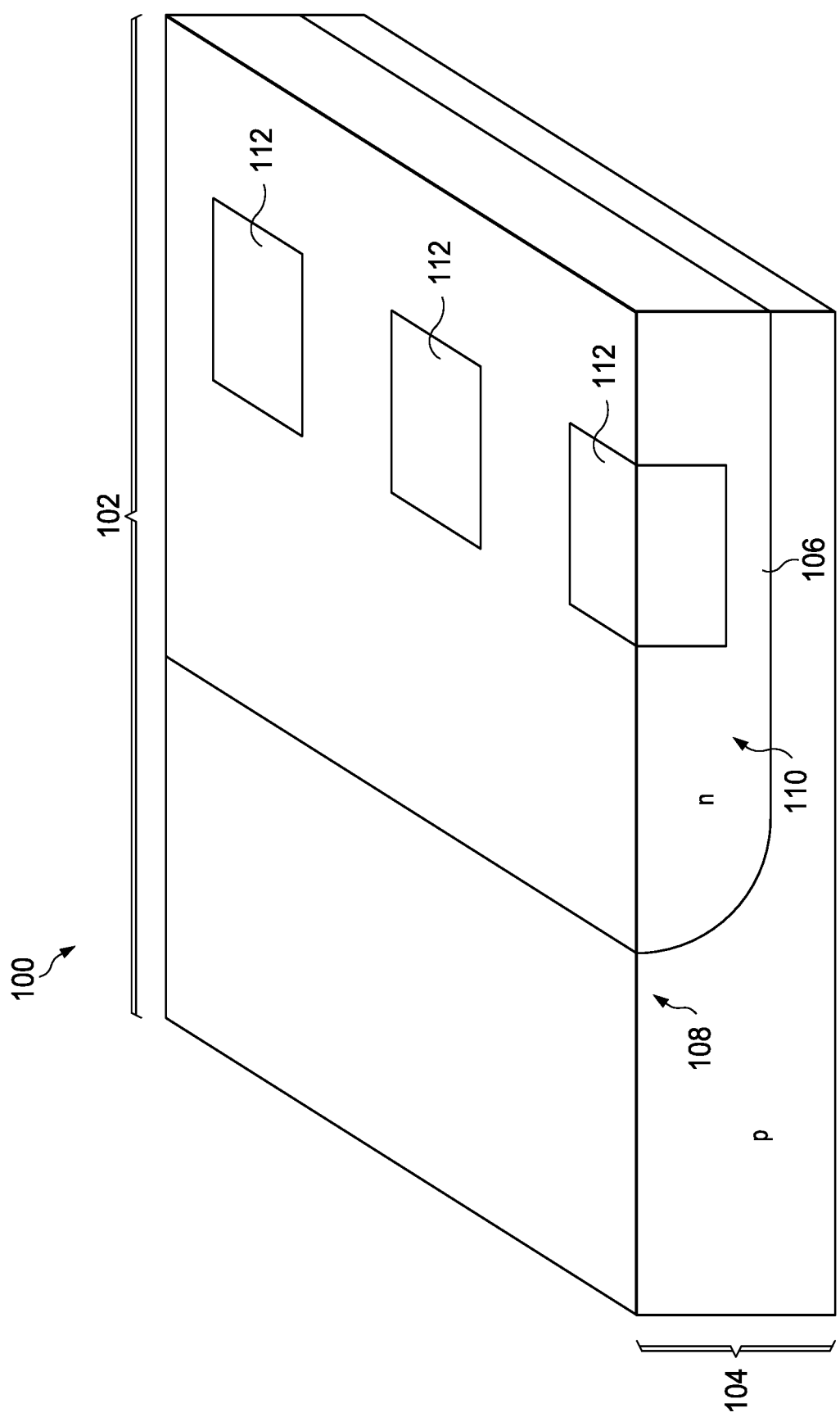
FIG. 1A and FIG. 1B are perspective views of an integrated circuit containing a hybrid active-field gap extended drain MOS transistor formed according to an embodiment, depicted in successive stages of fabrication.

The present disclosure is described with reference to the attached figures, wherein like reference numerals are used throughout the figures to designate similar or equivalent elements. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. One skilled in the relevant art, however, will readily recognize that the disclosure can be practiced without one or more of the specific details or with other methods. In other instances, well-known structures or operations are not shown in detail to avoid obscuring the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

An integrated circuit may include a hybrid active-field gap extended drain MOS transistor with multiple parallel alternating active gap drift regions and field gap drift regions. The field plates are extensions of the gate. The field plates terminate on field oxide elements in a drain of the extended drain MOS transistor.

Figure 1B:
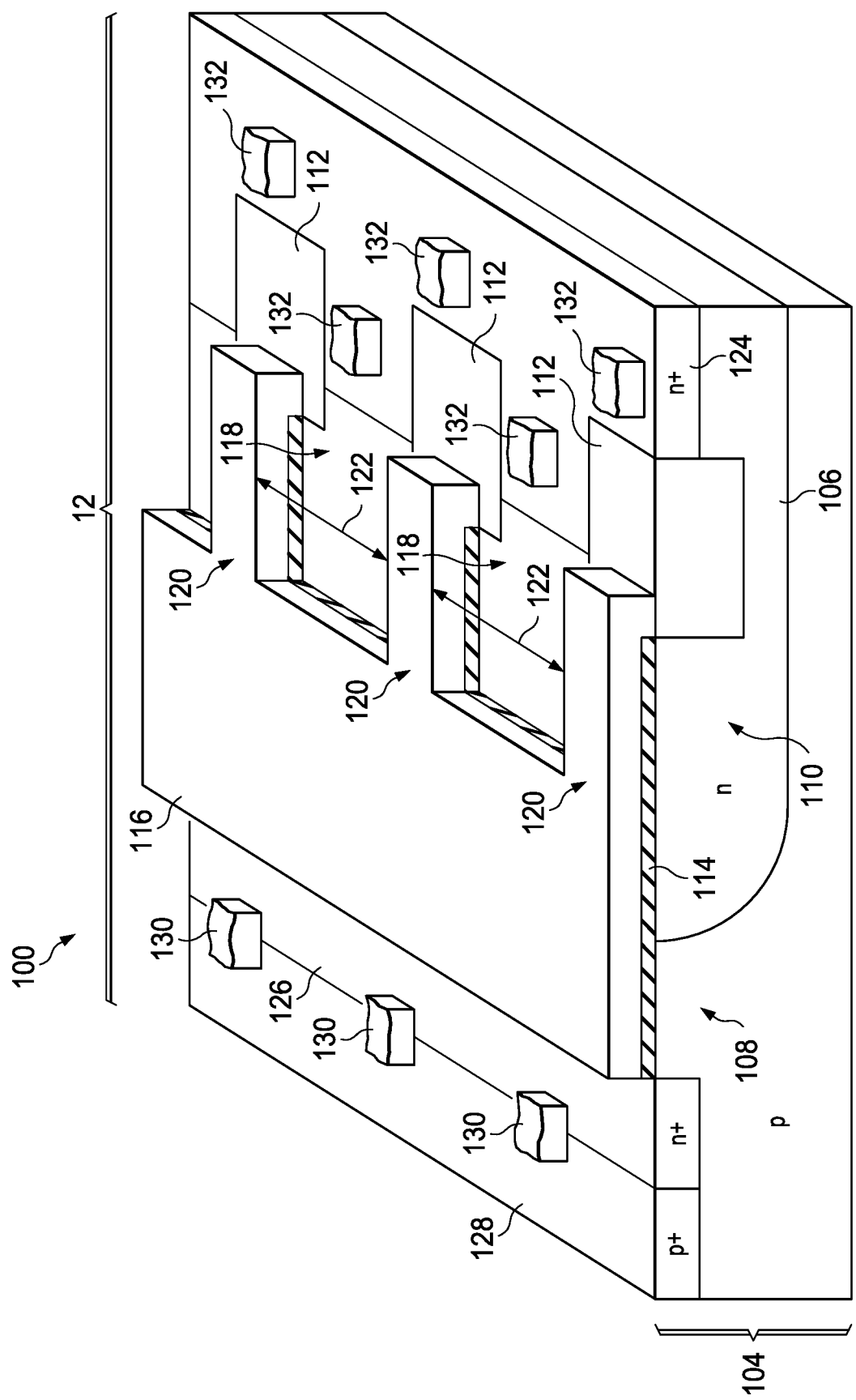

FIG. 1A and FIG. 1B are perspective views of an integrated circuit 1000 containing a hybrid active-field gap extended drain MOS transistor 102 formed according to an embodiment, depicted in successive stages of fabrication. The integrated circuit 100 is formed in and on a substrate 104, which may be a single crystal silicon wafer, a silicon-on-insulator (SOI) wafer, a hybrid orientation technology (HOT) wafer with regions of different crystal orientations, or other material appropriate for fabrication of the integrated circuit 100. An extended drain 106 of the extended drain MOS transistor 102 is formed in the substrate 104 abutting a channel region 108 of the extended drain MOS transistor 102. The extended drain 106 includes a drift region 110. The extended drain 106 may be formed, for example, by a process including the steps of: forming an ion implant mask of photoresist over the substrate 104 by a photolithographic process so as to expose an area for the extended drain 106, ion implanting dopants into the substrate 104 in the areas exposed by the ion implant mask, removing the ion implant mask and annealing the substrate 104 so as to activate the implanted dopants. Field oxide elements 112 are formed in the extended drain 106 adjacent to the drift region 110. The field oxide 112 may be, for example, primarily composed of silicon dioxide 250 to 600 nanometers thick. The field oxide elements 112 may be formed by shallow trench isolation (STI) processes as depicted in FIG. 1A, by local oxidation of silicon (LOCOS) processes, or by other methods. An STI process may include the steps of: forming an oxide layer on the substrate 104, forming a silicon nitride layer on the oxide layer, patterning the silicon nitride layer so as to expose an area for the field oxide 112, etching a trench in the substrate 104 in the exposed area to an appropriate depth for a desired thickness of the field oxide 112, growing a layer of thermal oxide on sidewalls and a bottom of the trench, filling the trench with silicon dioxide by chemical vapor deposition (CVD), high density plasma (HDP) or high aspect ratio process (HARP), removing unwanted silicon dioxide from a top surface of the silicon nitride layer, and removing the silicon nitride layer. A LOCOS process may include the steps of: forming an oxide layer on the substrate 104, forming a silicon nitride layer on the oxide layer, patterning the silicon nitride layer so as to expose an area for the field oxide 112, growing thermal oxide at the top surface of the substrate 104 in the exposed area to an appropriate thickness for a desired thickness of the field oxide 112, and removing the silicon nitride layer.

The extended drain 106 extends below the field oxide elements 112. In an alternate version of the instant embodiment, the field oxide elements 112 may be formed prior to forming the extended drain 106.

Referring to FIG. 1B, a gate dielectric layer 114 is formed on the substrate 104 over the channel region 108 and the drift region 110. The gate dielectric layer 114 may be, for example, one or more layers of silicon dioxide, silicon oxy-nitride, aluminum oxide, aluminum oxy-nitride, hafnium oxide, hafnium silicate, hafnium silicon oxy-nitride, zirconium oxide, zirconium silicate, zirconium silicon oxy-nitride, a combination of the aforementioned materials, or other insulating material. The gate dielectric layer 114 may include nitrogen as a result of exposure to a nitrogen containing plasma or a nitrogen containing ambient gas at temperatures between 50 C and 800 C. A thickness of the gate dielectric layer 114 may be 2.5 to 3.0 nanometers per volt of gate-source bias. The gate dielectric layer 114 may be formed by any of a variety of gate dielectric formation processes, for example thermal oxidation, plasma nitridation of an oxide layer, and/or dielectric material deposition by atomic layer deposition (ALD).

A gate 116 of the extended drain MOS transistor 102 is formed on the gate dielectric layer 114, so as to expose active gap regions 118 of the drift region 110, and so as to form field plates 120 between the active gap regions 118 extending onto the field oxide elements 112. The gate 116 may be formed, for example, by a process including the steps of: forming a layer of gate material such as polycrystalline silicon, commonly referred to as polysilicon, over the gate dielectric layer 114, forming a gate etch mask including photoresist over the gate material layer using a photolithographic process so as to cover an area for the gate 116, performing a gate etch process by a reactive ion etch (ME) process which removes material from the gate material layer in areas exposed by the gate etch mask, and removing the gate etch mask.

Areas of the drift region 110 under the field plates 120 are field gap drift regions. In one version of the instant embodiment, an active gap width 122 of each active gap region 118 between adjacent field plates 120 is less than 2 microns. In a further version, the active gap width 122 of each active gap region 118 is less than 1 micron. Gate sidewall spacers, not shown, may be formed on lateral surfaces of the gate 116.

A drain contact diffused region 124 is formed in the extended drain 106 abutting the active gap regions 118 and the field oxide elements 112. A source 126 of the extended drain MOS transistor 102 is formed in the substrate 104 abutting the channel region 108 and opposite the extended drain 106. The drain contact diffused region 124 and the source 126 may be formed concurrently, for example, by a process including the steps of: forming an ion implant mask of photoresist over an existing top surface of the integrated circuit 100 by a photolithographic process so as to expose an area for the drain contact diffused region 124 and an area for the source 126, ion implanting dopants into the substrate 104 in the areas exposed by the ion implant mask, removing the ion implant mask and annealing the substrate 104 so as to activate the implanted dopants.

A backgate contact diffused region 128 may be formed in the substrate 104 so as to make electrical connection with the channel region 108. The backgate contact diffused region 128, if formed, may be distributed as depicted in FIG. 1B or may be localized. The backgate contact diffused region 128 may be formed, for example, by a process including the steps of: forming an ion implant mask of photoresist over an existing top surface of the integrated circuit 100 by a photolithographic process so as to expose an area for the backgate contact diffused region 128, ion implanting dopants into the substrate 104 in the areas exposed by the ion implant mask, removing the ion implant mask and annealing the substrate 104 so as to activate the implanted dopants.

Source contacts 130 are formed on the source 126 and optionally the backgate contact diffused region 128 if present. Drain contacts 132 are formed on the drain contact diffused region 124. In one version of the instant embodiment, a drain contact 132 is formed adjacent to each active gap region 118 and adjacent to each field oxide element 112 opposite each field plate 120 overlapping the field oxide element 112. The contacts 130 and 132 may be formed, for example, by a process including the steps of: defining contact areas on a top surface of a pre-metal dielectric (PMD) layer over the substrate 104 with a contact photoresist pattern formed by a photolithographic process, etching contact holes in the contact areas by removing PMD layer material using an RIE process to expose the substrate 104, and filling the contact holes with a contact liner metal, such as titanium, and a contact fill metal, typically tungsten, followed by removal of the contact fill metal from the top surface of the PMD layer using etching and/or CMP methods.

During operation of the extended drain MOS transistor 102, the active gap regions 118 may provide a desired impedance through the drift region 110 while the field plates 120 may reduce an electric field in the active gap regions 118 so as to provide a desired high breakdown voltage and desired level of hot carrier reliability.

In one version of the instant embodiment, the extended drain MOS transistor 102 may be n-channel, as shown in FIG. 1A and FIG. 1B. In another version, the extended drain MOS transistor 102 may be p-channel.

Figure 2:
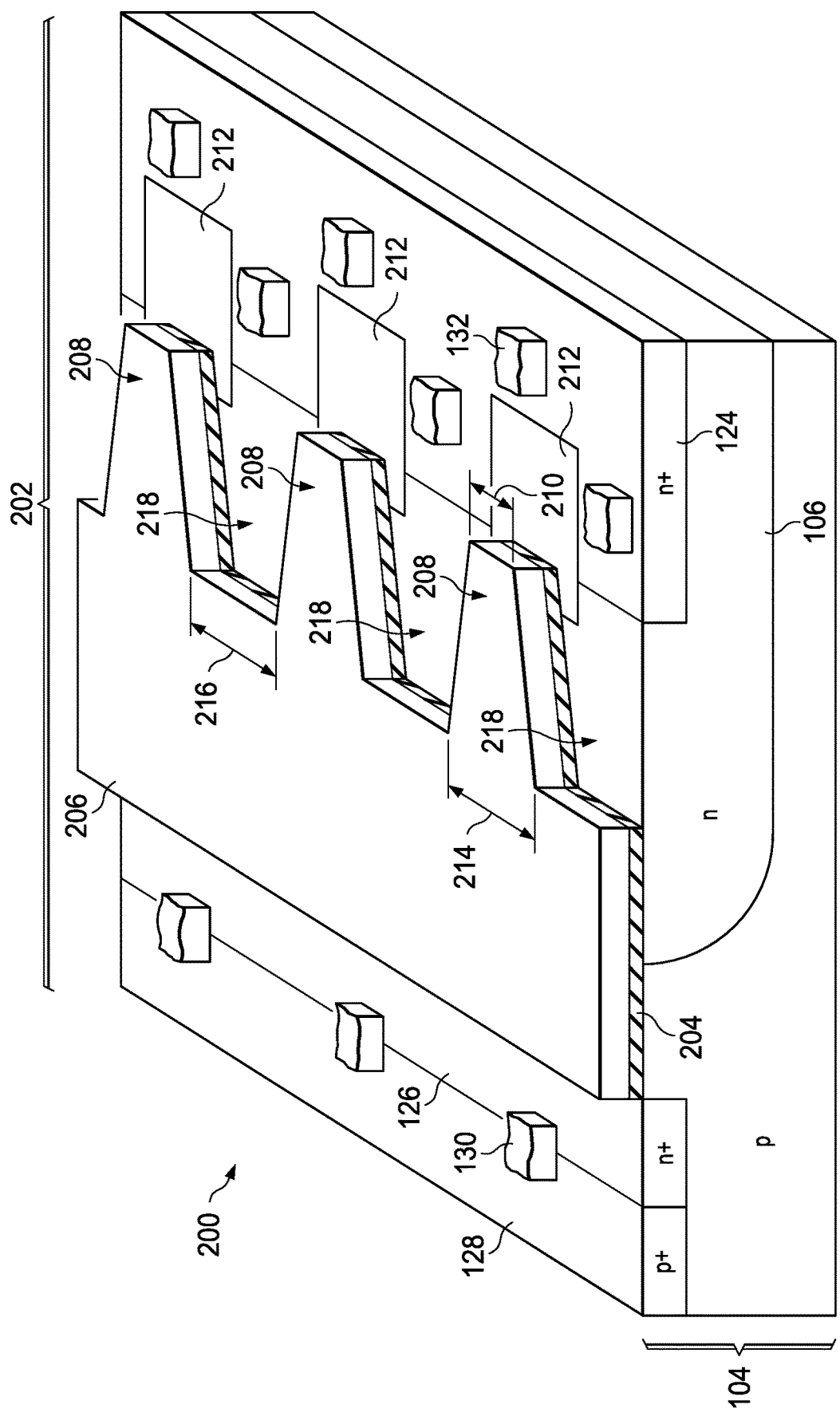
FIG. 2 is a perspective view of an integrated circuit containing a hybrid active-field gap extended drain MOS transistor formed according to another embodiment.

FIG. 2 is a perspective view of an integrated circuit 200 containing a hybrid active-field gap extended drain MOS transistor 202 formed according to another embodiment. A gate 206 of the extended drain MOS transistor 202 is formed on a gate dielectric layer 204 so as to have tapered field plates 208. A drain end width 210 of each tapered field plate 208 over field oxide elements 212 is at least 100 nanometers less than a source end width 214 of each tapered field plate 208 on an opposite side of the tapered field plate 208 from the corresponding field oxide element 212. In one version of the instant embodiment, a source end active gap width 216 of each active gap region 218 is less than 2 microns. In a further version, the source end active gap width 216 of each active gap region 218 is less than 1 micron. The drain end width 210 and the source end width 214 of each tapered field plate 208 are such that each point at a top surface of an active gap region is within a micron of an adjacent field plate in the field gap drift regions. Dimensions of the tapered field plates 208 and active gap regions 218 may be adjusted to provide desired values of breakdown voltage, on-state current and hot carrier reliability.

In one version of the instant embodiment, the extended drain MOS transistor 202 may be n-channel, as shown in FIG. 2. In another version, the extended drain MOS transistor 202 may be p-channel.

Figure 3:
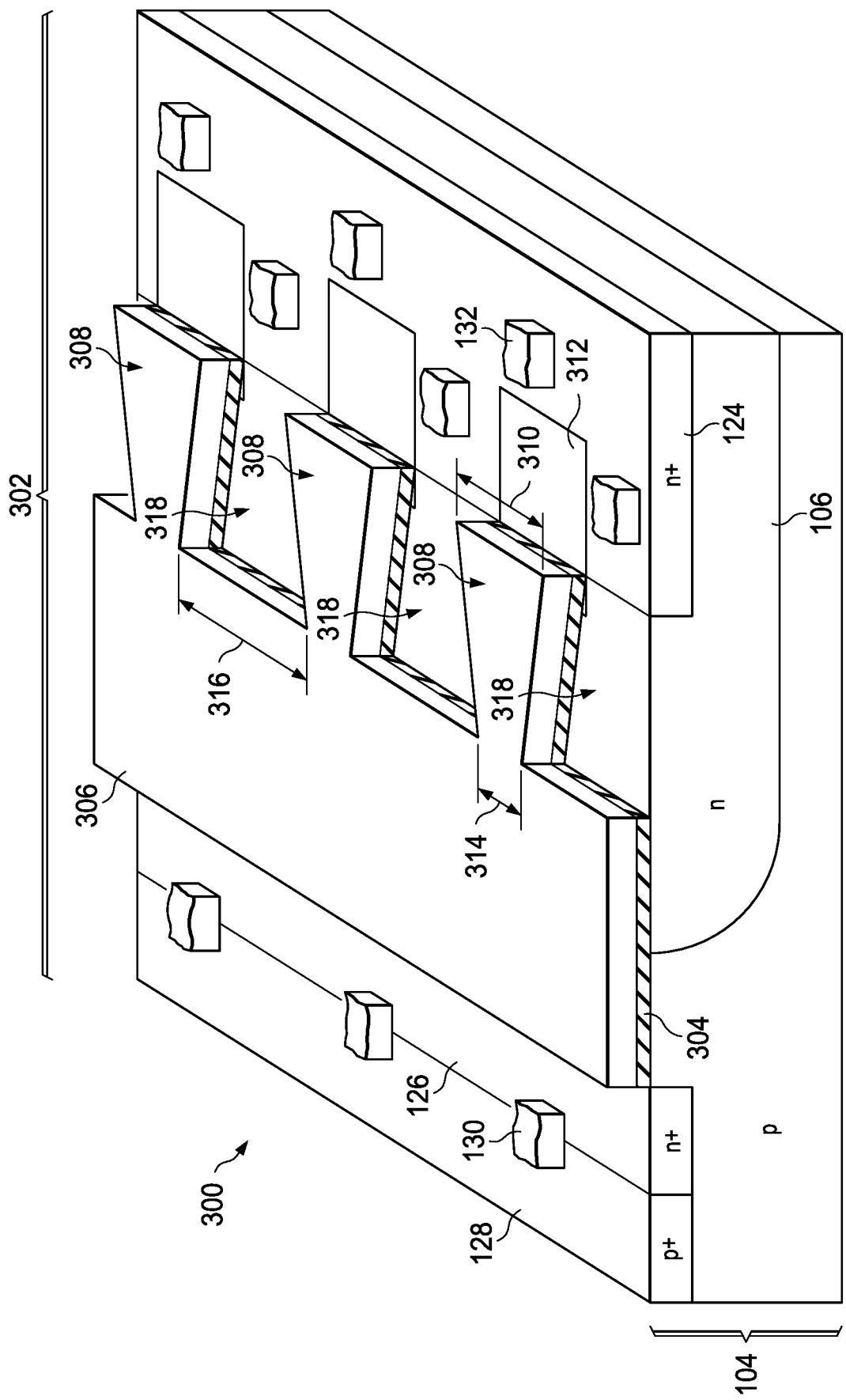
FIG. 3 is a perspective view of an integrated circuit containing a hybrid active-field gap extended drain MOS transistor formed according to a further embodiment.

FIG. 3 is a perspective view of an integrated circuit 300 containing a hybrid active-field gap extended drain MOS transistor 302 formed according to a further embodiment. A gate 306 of the extended drain MOS transistor 302 is formed over a gate dielectric layer 304 so as to have retrograde tapered field plates 308. A drain end width 310 of each retrograde tapered field plate 308 over field oxide elements 312 is at least 100 nanometers more than a source end width 314 of each retrograde tapered field plate 308 on an opposite side of the retrograde tapered field plate 308 from the corresponding field oxide element 312. In one version of the instant embodiment, a source end active gap width 316 of each active gap region 318 is less than 2 microns. In a further version, the source end active gap width 316 of each active gap region 318 is less than 1 micron. Dimensions of the retrograde tapered field plates 308 and active gap regions 318 may be adjusted to provide desired values of breakdown voltage, on-state current and hot carrier reliability.

In one version of the instant embodiment, the extended drain MOS transistor 302 may be n-channel, as shown in FIG. 3. In another version, the extended drain MOS transistor 302 may be p-channel.

Figure 4A:
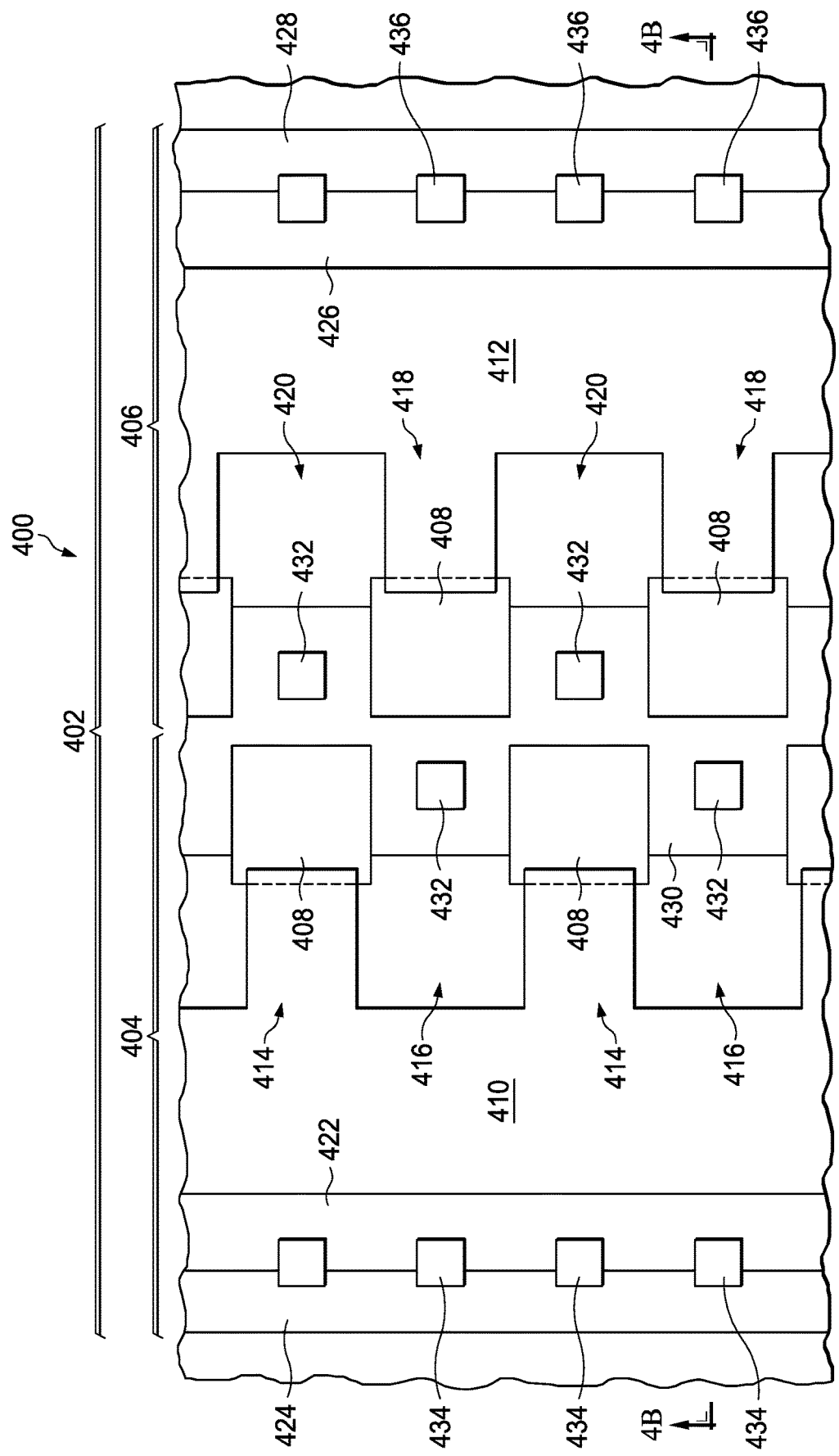
FIG. 4A and FIG. 4B are a top view and a cross section, respectively, of an integrated circuit containing a hybrid active-field gap extended drain MOS transistor formed in a symmetric nested configuration according to an embodiment.
Figure 4B:
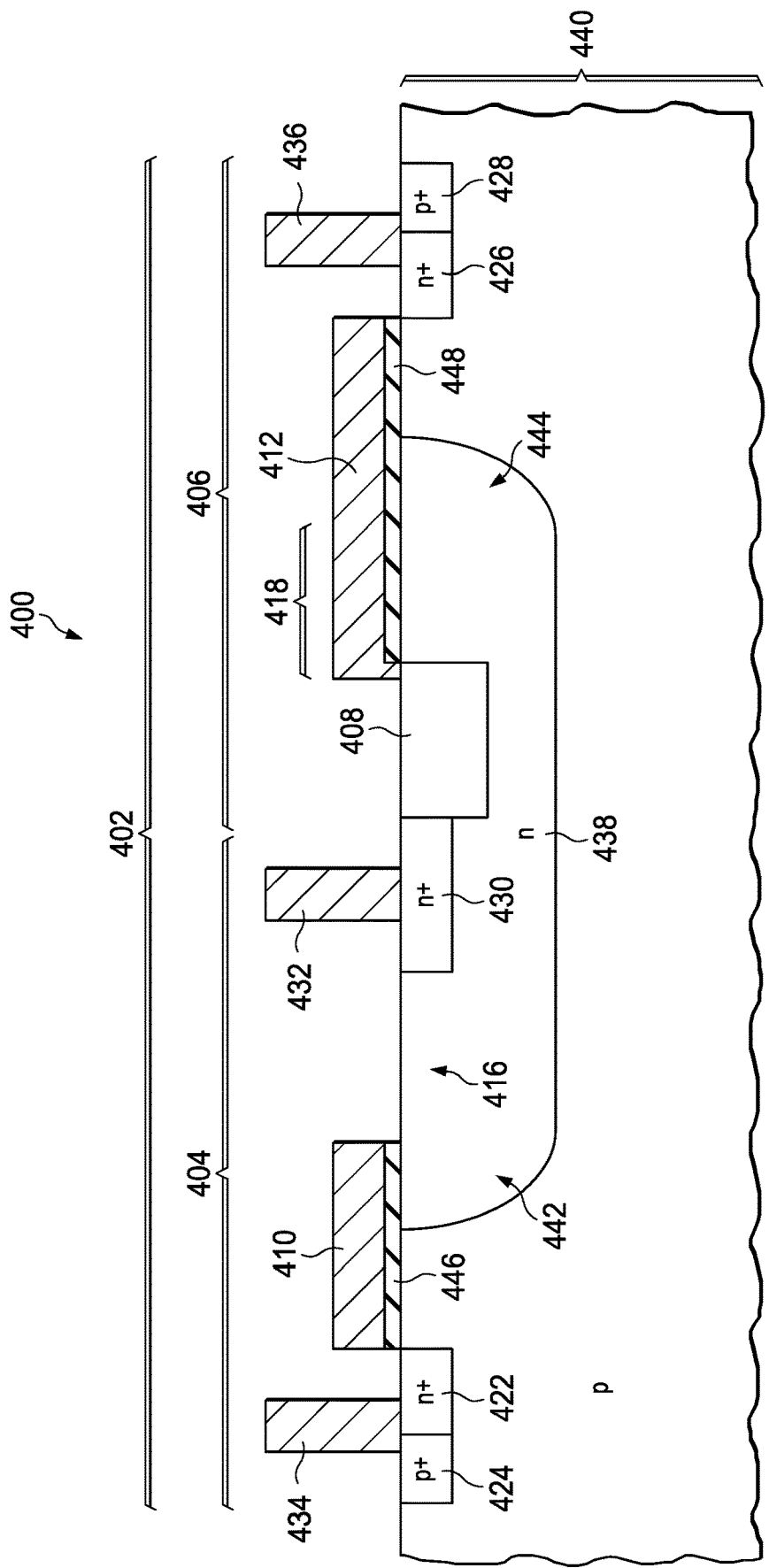

FIG. 4A and FIG. 4B are a top view and a cross section, respectively, of an integrated circuit 400 containing a hybrid active-field gap extended drain MOS transistor 402 formed in a symmetric nested configuration according to an embodiment. Referring to FIGS. 4A and 4B concurrently, the extended drain MOS transistor 402 includes a first portion 404 and a second portion 406. Field oxide elements 408 are formed in an extended drain 438, of the extended drain MOS transistor 402 in the first portion 404 and the second portion 406 in an alternating linear configuration as depicted in FIG. 4A. The extended drain 438 extends under the field oxide elements 408 and laterally past the field oxide elements 408 and includes a first drift region 442, in the first portion 404 and a second drift region 444, in the second portion 406. The extended drain MOS transistor 402 includes an unreferenced first channel region, between the extended drain 438 and a first source 422 in the first portion 404 abutting the first drift region 442, and includes an unreferenced second channel region, between the extended drain 438 and a second source 426 in the second portion 406 abutting the second drift region 444, so that the second channel region is located on an opposite side of the extended drain 438 from the first channel region. A first gate section 410 is formed on a gate dielectric layer 446 over the first drift region 442 and the and the first channel region. A second gate section 412 is formed on a gate dielectric layer 448, over the second drift region 444 and second channel region. The first gate section 410 and the second gate section 412 may optionally be joined at one or both ends of the extended drain MOS transistor 402. The first gate section 410 includes first field plates 414 extending onto the field oxide elements 408. The first field plates 414 cover unreferenced first field gap drift regions, alternating with first active gap regions 416, in the first portion 404. The second gate section 412 includes second field plates 418 extending onto the field oxide elements 408. The second field plates 418 cover unreferenced second field gap drift regions, alternating with second active gap regions 420, in the second portion 406. The first field plates 414 are aligned with the second active gap regions 420, and the second field plates 418 are aligned with the first active gap regions 416. In one version of the instant embodiment, an active gap width of each first active gap region 416 between adjacent first field plates 414 and of each second active gap region 420 between adjacent second field plates 418 is less than 2 microns. In a further version, the active gap width of each first active gap region 416 and each second active gap region 420 is less than 1 micron.

The first source 422 is formed in the first portion 404 abutting the first channel region and adjacent to the first gate section 410. A first backgate contact diffused region 424 may be formed adjacent to the first source 422 so as to make electrical connection with the first channel region. The second source 426 is formed in the second portion 406 abutting the second channel region and adjacent to the second gate section 412. A second backgate contact diffused region 428 may be formed adjacent to the second source 426 so as to make electrical connection with the second channel region. A drain contact diffused region 430 is formed in the extended drain abutting the first active gap regions 416 and the second active gap regions 420 and abutting the field oxide elements 408.

Drain contacts 432 are formed on the drain contact diffused region 430 adjacent to the first active gap regions 416 and the second active gap regions 420, so that each drain contact 432 provides drain current to the corresponding adjacent active gap region 416 or 420 and the corresponding field gap drift region opposite the active gap region. In one version of the instant embodiment, a drain contact 432 is formed adjacent to each first active gap region 416 and each second active gap region 420. First source contacts 434 are formed on the first source 422, and optionally on the first backgate contact diffused region 424 if present. Second source contacts 436 are formed on the second source 426, and optionally on the second backgate contact diffused region 428 if present. Dimensions and locations of the field oxide elements 408, the first active gap regions 416 and the second active gap regions 420, the first field gap drift regions and the second field gap drift regions, and the drain contact diffused region 430 may be adjusted to reduce a total area of the extended drain MOS transistor 402 while providing a desired on-state current, a desired breakdown voltage and a desired hot carrier reliability. In one version of the instant embodiment, the extended drain MOS transistor 402 may be n-channel, as shown in FIG. 4B. In another version, the extended drain MOS transistor 402 may be p-channel.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:
1. An integrated circuit, comprising:
an extended drain metal-oxide semiconductor (EDMOS) transistor, including:

a channel region positioned in a semiconductor substrate;
an extended drain positioned in the semiconductor substrate, the extended drain including a drift region having field gap drift regions and active gap regions alternating with the field gap drift regions, the drift region abutting the channel region;
field oxide structures positioned adjacent to the field gap drift regions and opposing the channel region; and
a drain contact diffused region positioned on the extended drain and having a plurality of lateral projections extending toward the channel region, the drain contact diffused region having a higher doping concentration than the extended drain, and the lateral projections interleaving with the field oxide structures.

2. The integrated circuit of claim 1, wherein the extended drain extends below the field oxide structures.

3. The integrated circuit of claim 1, further comprising:
a gate dielectric layer positioned over the channel region and the drift region; and
a gate positioned on the gate dielectric layer over the channel region.

4. The integrated circuit of claim 3, wherein the gate includes a field plate extending beyond the gate dielectric layer and onto the field oxide structures.

5. The integrated circuit of claim 4, wherein the field plate is rectangular.

6. The integrated circuit of claim 4, wherein the field plate is trapezoidal.

7. The integrated circuit of claim 4, wherein the field plate has a first shorter end and a second longer end, the longer end attached to the gate.

8. The integrated circuit of claim 1, further comprising:
drain contacts positioned on the drain contact diffused region, each drain contact spaced apart from a corresponding one of the field gap drift regions by a corresponding one of the field oxide structures.

9. The integrated circuit of claim 1, further comprising:
a drain contact positioned on the drain contact diffused region, the drain contact interposed between two of the field oxide structures.

10. The integrated circuit of claim 1, wherein at least one of the field oxide structures abuts at least one of the field gap drift regions, at least one of the active gap regions, and the drain contact diffused region.

11. The integrated circuit of claim 1, wherein at least one of the field oxide structures separates at least one of the field gap drift regions from the drain contact diffused region.

12. The integrated circuit of claim 1, wherein at least one of the field oxide structures interfaces an interface between at least one of the active gap regions and the drain contact diffused region.

13. The integrated circuit of claim 1, further comprising a source region, a gate being located between the source region and the field oxide structures.

14. The integrated circuit of claim 13, further comprising a back gate contact diffused region abutting the source region.

15. The integrated circuit of claim 13, further comprising source contacts conductively connected to the source region.

16. The integrated circuit of claim 15, further comprising a back gate contact diffused region abutting the source region, wherein the source contacts touch the source region and the back gate contact diffused region.

17. The integrated circuit of claim 1, wherein the channel region is a first channel region, the drift region is a first drift region, the field oxide structures are first field oxide structures, the field gap drift regions are first field gap drift regions; and the active gap regions are first active gap regions, and further comprising:
a second channel region, the extended drain being between the first and second channel regions;
a second drift region opposite the first drift region in the extended drain, the second drift region having second field gap drift regions and second active gap regions alternating with the second field gap drift regions, the second drift region abutting the second channel region;
a first gate dielectric layer positioned over the first channel region and the first drift region;
a second gate dielectric layer positioned over the second channel region and the second drift region;
a first gate positioned on the first gate dielectric layer over the first channel region;
a second gate positioned on the second gate dielectric layer over the second channel region; and
second field oxide structures positioned adjacent to the second field gap drift regions and opposing the second channel region, the second field oxide structures opposing the first active gap regions and the first field oxide structures opposing the second active gap regions.

18. An integrated circuit, comprising:
an extended drain metal-oxide semiconductor (EDMOS) transistor, including:
an extended drain in a semiconductor substrate between a first channel region and a second channel region, the extended drain including:
a first drift region abutting the first channel region and having alternating first field gap drift regions and first active gap regions; and
a second drift region abutting the second channel region and having alternating second field gap drift regions and second active gap regions;
a plurality of field oxide elements within the extended drain, each field oxide element laterally surrounded by the extended drain and touching a heavily doped drain contact diffused region that is within the extended drain, touches the first drift region and is directly connected to a plurality of drain contacts;
first field oxide elements being a first subset of the plurality of field oxide elements, each first field oxide element touching a corresponding one of the first field gap drift regions and positioned between the corresponding one of the first field gap drift regions and a corresponding one of the second active gap regions; and
second field oxide elements being a second subset of the plurality of field oxide elements, each second field oxide element touching a corresponding one of the second field gap drift regions and positioned between the corresponding one of the second field gap drift regions and a corresponding one of the first field gap drift regions.

19. The integrated circuit of claim 18, wherein the drain contact diffused region lies between the first channel region and the second channel region, and wherein each contact of a first subset of the drain contacts is located directly between adjacent ones of the first field oxide elements, and each contact of a second subset of the drain contacts is located directly between adjacent ones of the second field oxide elements.

20. The integrated circuit of claim 18, further comprising a first gate section having first field plates, each of the first field plates partially overlapping a corresponding one of the first field oxide elements, and a second gate section having second field plates, each of the second field plates partially overlapping a corresponding one of the second field oxide elements.

21. A transistor, comprising:
a first channel region and a second channel region in a semiconductor substrate;
an extended drain between the first channel region and the second channel region;
a plurality of active gap regions and field gap drift regions within the extended drain, the active gap regions and field gap drift regions arranged in a first linear array of active gap regions alternating with field gap drift regions and a second linear array of active gap regions alternating with field gap drift regions, the first linear array parallel to the second linear array; and
a plurality of field oxide elements within the extended drain, the field oxide elements arranged in a first linear array of field oxide elements and a second linear array of field oxide elements,
wherein the first linear array of active gap regions and the first linear array of field oxide elements are offset from the second linear array of active gap regions and the second linear array of field oxide elements such that each field oxide element is located between a corresponding one of the active gap regions and a corresponding one of the field gap drift regions.

22. The transistor of claim 21, further comprising a plurality of drain contacts, each drain contact located between a corresponding one of the field oxide elements and a corresponding one of the active gap regions.

23. The transistor of claim 21, further comprising a first gate section having first field plates each located over a corresponding one of the field gap drift regions of the first linear array, and a second gate section having second field plates each located over a corresponding one of the field gap drift regions of the second linear array.

24. The transistor of claim 23, further comprising a plurality of drain contacts, each field oxide element located between a corresponding one of the drain contacts and a corresponding one of the field plates.

25. A transistor, comprising:
a drain region in a semiconductor substrate;
first, second and third field oxide elements within the drain region, each field oxide element laterally surrounded by and separated from others of the field oxide elements by the drain region and abutting a same heavily doped drain contact diffused region located within the drain region and directly connected to first, second and third contacts;
a first row including a first field plate over the drain region, the first contact and the first field oxide element between the first field plate and the first contact;
a second row including a second field plate over the drain region, the second contact and the second field oxide element between the second field plate and the second contact;
a third row including a third field plate over the drain region, the third contact and the third field oxide element between the third field plate and the third contact,
wherein the second contact is between the first and third field oxide elements and the second field oxide element is between the first and third contacts.

26. The transistor of claim 25, further comprising an active gap region between the first and third field plates.

27. The transistor of claim 25, wherein the first and third field plates extend from a first gate section and the second field plate extends from a second gate section, the first and second gate sections overlying opposite sides of the drain region.

28. The transistor of claim 27, further comprising first and second sources running parallel to the drain region, the drain region located between the first and second sources.

* * * * *